United States Patent
Varghese

(10) Patent No.: US 11,282,983 B2
(45) Date of Patent: Mar. 22, 2022

(54) SEMICONDUCTOR CHIP WITH TRANSPARENT CURRENT SPREADING LAYER

(71) Applicant: Osram OLED GmbH, Regensburg (DE)

(72) Inventor: Tansen Varghese, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 108 days.

(21) Appl. No.: 16/626,911

(22) PCT Filed: Jun. 21, 2018

(86) PCT No.: PCT/EP2018/066644
§ 371 (c)(1),
(2) Date: Dec. 27, 2019

(87) PCT Pub. No.: WO2019/002097
PCT Pub. Date: Jan. 3, 2019

(65) Prior Publication Data
US 2020/0144446 A1    May 7, 2020

(30) Foreign Application Priority Data
Jun. 29, 2017    (DE) .......................... 102017114467.6

(51) Int. Cl.
*H01L 33/14*    (2010.01)
*H01L 33/00*    (2010.01)
(Continued)

(52) U.S. Cl.
CPC .......... *H01L 33/14* (2013.01); *H01L 33/0066* (2013.01); *H01L 33/22* (2013.01);
(Continued)

(58) Field of Classification Search
CPC ..... H01L 33/14; H01L 33/0066; H01L 33/22; H01L 33/30; H01L 33/382; H01L 33/44;
(Continued)

(56) References Cited

U.S. PATENT DOCUMENTS

| 5,300,791 A | 4/1994 | Chen et al. |
| 2007/0290216 A1 | 12/2007 | Watanabe |

(Continued)

FOREIGN PATENT DOCUMENTS

| DE | 102004039870 A1 | 3/2005 |
| DE | 102008039790 A1 | 3/2010 |

(Continued)

OTHER PUBLICATIONS

German Search Report issued for corresponding application No. 10 2017 114 467.6, dated Mar. 28, 2018, 12 pages (for informational purpose only).

(Continued)

*Primary Examiner* — Mohammed R Alam
(74) *Attorney, Agent, or Firm* — Viering, Jentschura & Partner mbB

(57) ABSTRACT

A semiconductor chip may have a radiation-permeable support, a semiconductor body, and a transparent current spreading layer. The semiconductor body may have an n-sided semiconductor layer, a p-sided semiconductor layer, and an optically active area therebetween. The semiconductor body may be secured to the support by means of a radiation permeable connection layer. The current spread layer may be based on zinc selenide and may be adjacent to the n-sided semi-conductor layer. A method for producing this type of semiconductor chip is also disclosed.

20 Claims, 11 Drawing Sheets

(51) Int. Cl.
  *H01L 33/22* (2010.01)
  *H01L 33/30* (2010.01)
  *H01L 33/38* (2010.01)
  *H01L 33/44* (2010.01)
  *H01L 33/52* (2010.01)

(52) U.S. Cl.
  CPC ............ *H01L 33/30* (2013.01); *H01L 33/382* (2013.01); *H01L 33/44* (2013.01); *H01L 33/52* (2013.01); *H01L 2933/005* (2013.01); *H01L 2933/0025* (2013.01)

(58) Field of Classification Search
  CPC ............. H01L 33/52; H01L 2933/0025; H01L 2933/005; H01L 33/26; H01L 33/38; H01L 33/385
  See application file for complete search history.

(56) References Cited

U.S. PATENT DOCUMENTS

| | | |
|---|---|---|
| 2014/0159090 A1 | 6/2014 | Huang et al. |
| 2014/0203413 A1 | 7/2014 | Baur et al. |
| 2015/0207011 A1 | 7/2015 | Garnett et al. |
| 2016/0225953 A1 | 8/2016 | Meitl et al. |
| 2016/0254253 A1 | 9/2016 | Meitl et al. |
| 2017/0155015 A1* | 6/2017 | Ou .................. H01L 33/20 |
| 2018/0219131 A1* | 8/2018 | Park ................ H01L 33/54 |

FOREIGN PATENT DOCUMENTS

| | | |
|---|---|---|
| DE | 102011012298 A1 | 6/2012 |
| DE | 102013103605 A1 | 10/2014 |
| KR | 100592395 B1 | 6/2006 |
| WO | 9415369 A1 | 7/1994 |
| WO | 2017026753 A1 | 2/2017 |

OTHER PUBLICATIONS

International Search Report issued for corresponding PCT-Application No. PCT/EP2018/066644, dated Sep. 30, 2018, 3 pages (for informational purpose only).

* cited by examiner

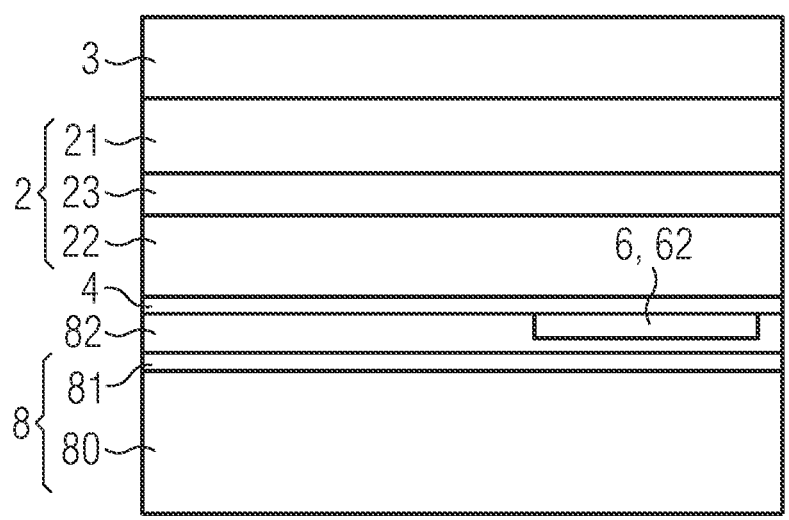

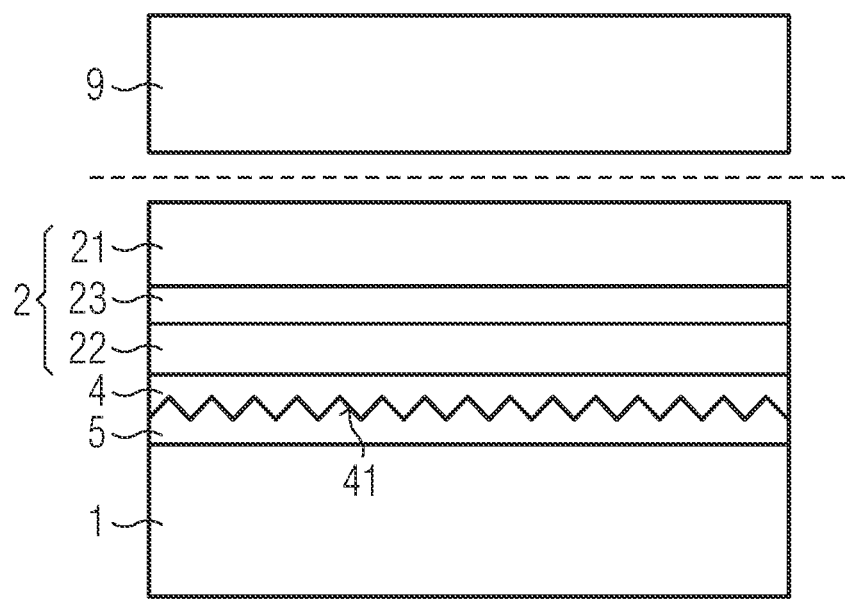

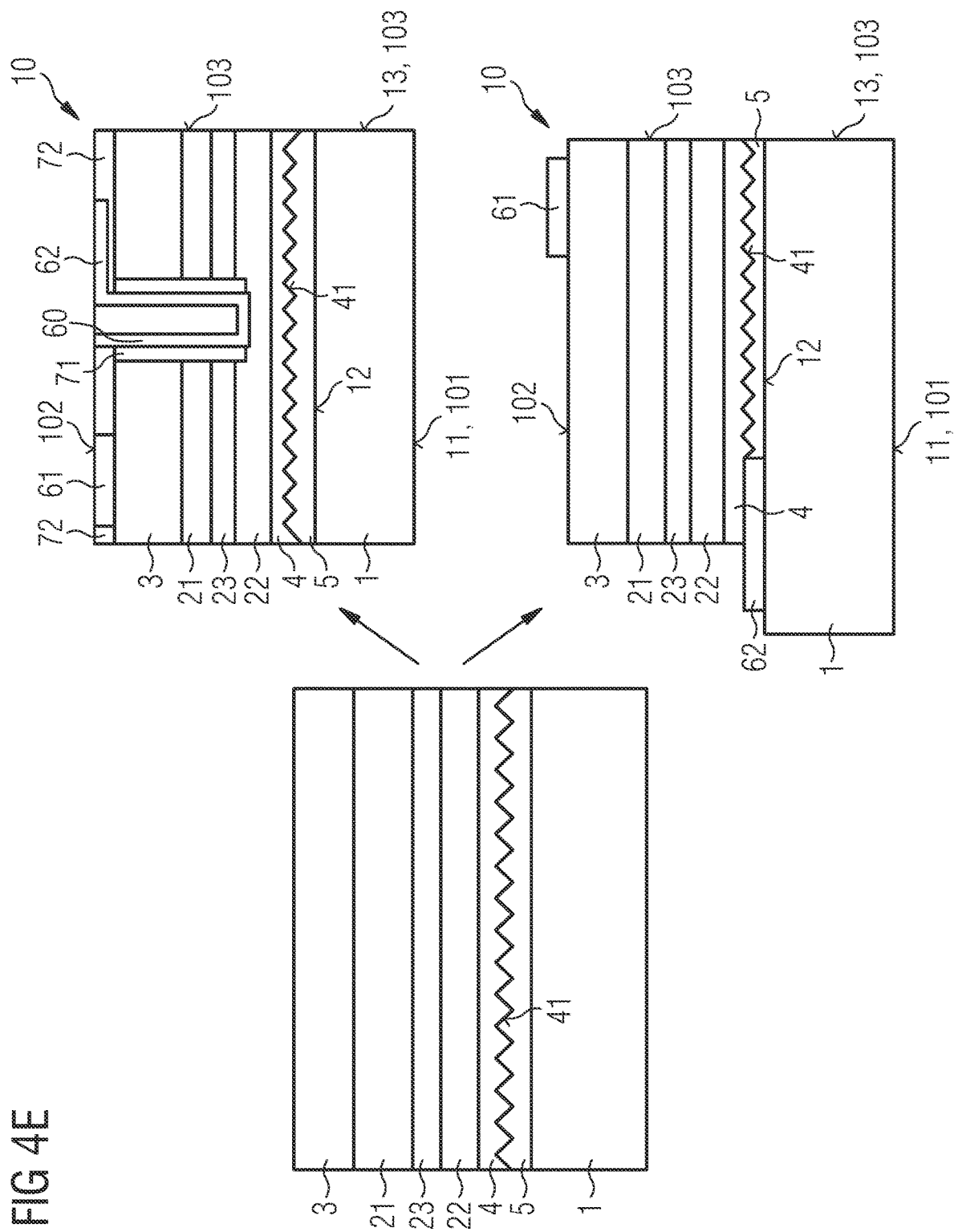

SEMICONDUCTOR CHIP WITH TRANSPARENT CURRENT SPREADING LAYER

CROSS-REFERENCE TO RELATED APPLICATIONS

The present application is a national stage entry according to 35 U.S.C. § 371 of PCT application No.: PCT/EP2018/066644 filed on Jun. 21, 2018; which claims priority to German Patent Application Serial No.: 10 2017 114 467.6, which was filed on Jun. 29, 2017; both of which are incorporated herein by reference in their entirety and for all purposes.

TECHNICAL FIELD

A semiconductor chip with a transparent current spreading layer is specified.

Furthermore, a method for producing a semiconductor chip or a plurality of semiconductor chips is specified.

BACKGROUND

Conventional semiconductor chips usually have an n-side semiconductor layer, a p-side semiconductor layer and an active zone located therebetween, wherein for achieving an even current density distribution, current spreading layers are arranged on both sides of the active zone. In each case, such current spreading layers may be based on the same material as the semiconductor layers of the semiconductor chip, but with increased doping or increased Al-content. Excessive doping in the current spreading layers may lead to a reduction in carrier mobility and in overall to an increased the forward voltage of the semiconductor chip. A high Al-content usually leads to increased internal mechanical stress due to lattice mismatches.

Alternatively, it is possible to form current spreading layers from transparent electrically conductive oxides on semiconductor layers. However, the formation of transparent electrically conductive oxides on semiconductor layers also leads to increased internal mechanical stresses in the semiconductor chip.

SUMMARY

One object is to specify an efficient semiconductor chip. Moreover, a simplified method for producing one or a plurality of such semiconductor chips having high material quality is specified.

According to at least one embodiment of a semiconductor chip, it has a radiation-transmissive carrier and a semiconductor body. The semiconductor body has a first for instance n-side semiconductor layer, a second in particular p-side semiconductor layer and an active zone arranged vertically between the first semiconductor layer and the second semiconductor layer. An n-side semiconductor layer is particularly n-conductive and can be an n-doped semiconductor layer. A p-side semiconductor layer is especially p-conductive and can be a p-doped semiconductor layer. The active zone, for example, is a pn-junction.

For example, the semiconductor body is based on a III-V semiconductor material, for instance on gallium phosphide (GaP) or gallium arsenide (GaAs). During operation of the semiconductor chip, the optically active zone is especially configured to emit or detect electromagnetic radiation in the visible, ultraviolet or infrared spectral range. In particular, the semiconductor chip has a diode structure. For example, the semiconductor chip is a light-emitting diode (LED).

A vertical direction is generally understood to be a direction that is directed transversely, in particular perpendicularly, to a main extension surface of the semiconductor body. The vertical direction is for instance a growth direction of the semiconductor body. A lateral direction, on the other hand, is understood to be a direction that runs along, in particular parallel to, the main extension surface of the semiconductor body. The vertical direction and the lateral direction are perpendicular to each other.

A semiconductor body based on a III-V semiconductor material has at least one element or several elements from the third main group and at least one element or several elements from the fifth main group of the periodic table of chemical elements. In this case, the semiconductor layers based on a III-V semiconductor material may each have several sublayers and may be n-doped, p-doped or undoped.

The radiation-transmissive carrier can be made of silicon carbide (SiC), glass or of a glass-like material. In particular, the carrier is formed with regard to the material and the layer thickness such that the carrier has a transmittance of at least 60%, 70%, 80% or at least 90% with respect to a peak-wavelength of the electromagnetic radiation generated during operation of the semiconductor chip. In this context, a radiation-transmissive or transparent layer is generally understood to mean a layer which, with respect to light in the visible wavelength range, for instance between 380 nm and 780 nm, for example at 550 nm, has a transmittance of at least 60%, 70%, 80% or at least 90%. In case of doubt, a transparent layer may have a higher transmittance than a radiation-transmissive layer, for instance by 5%, 10%, 20%.

According to at least one embodiment of the semiconductor chip, the semiconductor body is attached to the carrier by a radiation-transmissive connecting layer. In particular, the semiconductor chip is formed as a volume emitter. In the case of a volume emitter, the electromagnetic radiation generated during operation of the semiconductor chip is able to be coupled out via a front side, a rear side and side surfaces of the semiconductor chip. For example, the carrier has a front side facing away from the semiconductor body, which forms the front side of the semiconductor chip. The side surfaces of the semiconductor chip can be formed by side surfaces of the carrier.

If the carrier and the connecting layer are radiation-transmissive, the radiation generated in the active zone can be partially coupled out from the semiconductor chip at the side surfaces and at the front side of the carrier. In particular, the semiconductor chip is formed such that at least 30%, 40%, 50%, 60% or at least 70% of the total radiation generated in the active zone is coupled out from the semiconductor chip at the side surfaces and/or at the front side of the carrier.

According to at least one embodiment of the semiconductor chip, it has a transparent current spreading layer. The current spreading layer is particularly adjacent to the n-side semiconductor layer of the semiconductor body. In a non-limiting embodiment, the current spreading layer is based on zinc selenide (ZnSe).

ZnSe-based means in this context that the current spreading layer consists of zinc selenide or contains zinc and selenium as main components, wherein the current spreading layer may contain further elements from the second and/or from the sixth main or subgroup of the periodic table of chemical elements. In particular, the substance amount fraction of zinc and selenium in such a compound material shall be at least 60, 70, 80, 90 or at least 95%. The ZnSe-based current spreading layer may be n-conductively doped.

In at least one embodiment of a semiconductor chip, it includes a radiation-transmissive carrier, a semiconductor body and a transparent current spreading layer. The semiconductor body has an n-side semiconductor layer, a p-side semiconductor layer and an optically active zone located therebetween. The semiconductor body is attached to the carrier by a radiation-transmissive or transparent connecting layer. The current spreading layer is based on zinc selenide and adjoins the n-side semiconductor layer.

The ZnSe-based current spreading layer thus serves as the n-side current spreading layer of the semiconductor chip. Zinc selenide is characterized in particular by high electrical conductivity and a high transmittance in both the infrared and visible wavelength ranges. It has been shown that compared to highly doped current spreading layers or to current spreading layers made of transparent, electrically conductive materials, a forward voltage of the semiconductor chip including a ZnSe-based current spreading layer is reduced, as a result of which the overall efficiency of the semiconductor chip is increased.

According to at least one embodiment of the semiconductor chip, the semiconductor body is based on a III-V semiconductor compound material, wherein the semiconductor chip is free of a III-V growth substrate. For example, the semiconductor body can first be grown on a III-V substrate by an epitaxial process, wherein the substrate is removed from the semiconductor body in a subsequent process step. The radiation-transmissive carrier is thus different from a growth substrate and is attached to the semiconductor body by the connecting layer.

According to at least one embodiment of the semiconductor chip, the carrier is made of an electrically insulating and radiation-transmissive material. The electrically insulating material may be glass, glass-like materials, silicon or silicon carbide or may consist of one of these materials. It is also possible that the electrically insulating material is different from a semiconductor material. The carrier has a front side facing away from the semiconductor body and a rear side facing towards the semiconductor body. In particular, the front side of the carrier is free of electrical connections of the semiconductor chip.

According to at least one embodiment of the semiconductor chip, the semiconductor body is based on InGaP or InGaAlP. In particular, the semiconductor chip is free of a current spreading layer made of InAlP. In other words, the semiconductor chip is free of an n-side current spreading layer which is located between the carrier and the n-side semiconductor layer and contains an InAlP-based material. The transparent ZnSe-based current spreading layer is thus the only n-side current spreading layer of the semiconductor chip. Furthermore, the semiconductor chip can be free of an n-side and/or p-side current spreading layer made of a transparent electrically conductive oxide.

According to at least one embodiment of the semiconductor chip, it has a further radiation-transmissive current spreading layer. In particular, the further current spreading layer is adjacent to the p-side semiconductor layer and thus serves as the p-side current spreading layer of the semiconductor chip. In a non-limiting embodiment, the further current spreading layer is based on GaP. Similar to zinc selenide, gallium phosphide is a material having high electrical conductivity and a high degree of transmission of electromagnetic radiation in the visible and infrared wavelength ranges.

In this case, the semiconductor chip is for instance free of a current spreading layer made of AlGaAs. The semiconductor chip includes the additional GaP-based current spreading layer especially as the only p-side current spreading layer. A semiconductor chip having a ZnSe-based n-side current spreading layer and simultaneously including a GaP-based p-side current spreading layer has a lower forward voltage and thus a higher efficiency compared to semiconductor chips that have current spreading layers made of highly doped semiconductor layers or of transparent electrically conductive oxides. The combination of the n-side ZnSe-based current spreading layer and the p-side GaP-based current spreading layer is particularly suitable for increasing the efficiency of a volume emitter.

According to at least one embodiment of the semiconductor chip, it has a front side facing towards the carrier and a rear side facing away from the carrier. The semiconductor chip has at least one contact layer on the rear side, wherein the contact layer on the rear side is freely accessible. The semiconductor chip may have a further freely accessible contact layer on the rear side. The contact layer and the further contact layer can be assigned to different electrical polarities of the semiconductor chip and configured for electrically contacting the semiconductor chip.

Alternatively, it is also possible for the further contact layer to be arranged at least regionally between the semiconductor body and the carrier. The further contact layer can be adjacent to the connecting layer.

In a non-limiting embodiment, the semiconductor chip can be electrically contacted only via the rear side by the contact layers. The front side of the semiconductor chip is especially free of contact layers and can be a front side of the carrier.

According to at least one embodiment of the semiconductor chip, the n-side current spreading layer is arranged between the semiconductor body and the connecting layer or the carrier. Alternatively, the semiconductor body may be arranged between the n-side current spreading layer and the connecting layer or the carrier.

According to at least one embodiment of the semiconductor chip, it has a through-via configured for electrically contacting the n-side semiconductor layer. The current spreading layer can be arranged between the semiconductor body and the connecting layer. In particular, the through-via extends from the rear side throughout the p-side semiconductor layer and the active zone into the n-side semiconductor layer. In particular, through-via ends within the n-side semiconductor layer and is thus in direct electrical contact with the n-side semiconductor layer. It has been found that a contact resistance between the through-via and the ZnSe-based current spreading layers is usually higher than an electrical resistance between the through-via and the n-side semiconductor layer. In this case, the through-via may not be in direct electrical contact with the current spreading layer. The through-via may include a metal such as copper, nickel, aluminum, silver or gold.

According to at least one embodiment of the semiconductor chip, the through-via extends from the rear side throughout the p-side semiconductor layer, the active zone and the n-side semiconductor layer. The through-via can be fully enclosed in lateral directions by the p-side semiconductor layer, the active zone and/or the n-side semiconductor layer. Alternatively, it is possible that the through-via extends throughout the active zone and/or the semiconductor layers, but are located sideways to the semiconductor body and are therefore not completely enclosed by the active zone and/or the semiconductor layers. In particular, the through-via is not in direct electrical contact with the n-side semiconductor layer. For example, the n-side semiconductor layer is electrically conductively connected to the through-via at first via the n-side ZnSe-based current spreading layer.

According to at least one embodiment of the semiconductor chip, the through-via is configured for electrically contacting the p-side semiconductor layer. In this case, the semiconductor body can be arranged between the current spreading layer and the connecting layer. The through-via extends from the rear side of the semiconductor chip throughout the n-side current spreading layer, the n-side semiconductor layer and the active zone. The through-via is electrically isolated from the n-side current spreading layer, the n-side semiconductor layer and the active zone by an insulation layer. The through-via can be in direct electrical contact with the p-side semiconductor layer or in direct electrical contact with the further p-side current spreading layer.

According to at least one embodiment of the semiconductor chip, it has an internal structured surface. The structured surface can have out-coupling structures. For example, the inner structured surface is arranged between the active zone and the carrier. The inner structured surface can be a surface of the n-side or p-side current spreading layer or a surface of the n-side or p-side semiconductor layer. The out-coupling structures can be elevations or depressions which in particular are formed to reduce total reflections within the semiconductor chip. The inner structured surface can thus be arranged completely inside the semiconductor chip.

Alternatively or additionally, the semiconductor chip may have at least one outer structured surface, such as a structured front side and/or a structured rear side, wherein the outer structured surface for instance spatially delimits the semiconductor chip in a vertical direction.

According to at least one embodiment of the semiconductor chip, for reducing the lattice mismatch between the n-side semiconductor layer and the ZnSe-based current spreading layer, the ZnSe-based current spreading layer has at least one of the additional chemical elements from the group consisting of S, Cd, Mg and Be. For example, the substance amount fraction of S, Mg, Cd and/or Be in the ZnSe-based current spreading layer is at most 3%, 5% or 10%, for instance between 0.1 and 10% inclusive. The n-side current spreading layer and/or an n-side contact layer can be a ZnSSe MgZnSSe, MgZnSe, BeZnSe, ZnCdSe or a BeMgZnSe layer.

In at least one embodiment of a component, it has a semiconductor chip and a radiation-transmissive encapsulation, wherein the semiconductor chip of the component is in particular a semiconductor chip described here. In a non-limiting embodiment, the encapsulation has a lower refractive index than the carrier of the semiconductor chip. For example, the semiconductor chip is encapsulated by the encapsulation in such a way that the carrier is completely embedded within the encapsulation. The semiconductor chip can have a contact layer or several contact layers on its rear side for electrically contacting the semiconductor body. The contact layer or contact layers on the rear side of the semiconductor chip can be at least partially free of a material of the encapsulation. The rear side of the semiconductor chip thus forms the rear side of the component in places. In particular, the component can be electrically contacted only via its rear side, wherein the contact layers of the semiconductor chip are freely accessible on the rear side of the component.

If the semiconductor chip is encapsulated in an encapsulation with a lower refractive index, a refractive index jump between the semiconductor chip and the environment, such as air, is gradually reduced, as a result of which radiation losses due to total reflections can be minimized, and the efficiency of the component or of the semiconductor chip is thus increased. A difference in refractive indices is at least 0.1, 0.2, 0.3 or at least 0.5, for instance between 0.1 and 2 inclusive.

In at least one exemplary embodiment of a method for producing one or a plurality of semiconductor chips, a growth substrate is provided. The semiconductor body is applied onto the growth substrate by a coating process, for instance by an epitaxial process. In a subsequent process step, the semiconductor body is attached to a radiation-transmissive carrier by a radiation-transmissive connecting layer. The growth substrate can be removed from the semiconductor body prior to or after the formation of a current spreading layer, for instance of an n-side ZnSe-based current spreading layer, and prior to or after the attachment of the semiconductor body to the radiation-transmissive carrier. In order to produce a plurality of semiconductor chips, the semiconductor body and/or the radiation-transmissive carrier can be singulated.

In accordance with at least one embodiment of the method, the p-side semiconductor layer, the n-side semiconductor layer and the transparent n-side current spreading layer are formed on the growth substrate in the order given. An exposed surface of the transparent n-side current spreading layer can be structured, particularly before the radiation-transmissive carrier is applied to the semiconductor body. The growth substrate can be removed from the semiconductor body after the attachment of the carrier.

The semiconductor body and the n-side ZnSe-based current spreading layer can thus be formed on the growth substrate during a common, especially single, coating process. In addition, this variant only requires a single bonding step.

According to at least one embodiment of the method, the n-side semiconductor layer and the p-side semiconductor layer are formed on the growth substrate in the order given. The transparent n-side current spreading layer can be formed on the n-side semiconductor layer after the removal of the growth substrate.

If the n-side semiconductor layer is grown on the growth substrate prior to the A-side semiconductor layer, the semiconductor body can be produced with a particularly high material quality due to lower diffusion of the p-side dopants. The process for forming the n-side current spreading layer, however, is separated from the process for forming the semiconductor body, which makes this variant for producing the semiconductor chip more complex. If, on the other hand, the p-side semiconductor layer is applied to the growth substrate prior to the n-side semiconductor layer, the n-side current spreading layer can be applied to the n-side semiconductor layer in the same process step. However, this requires much more precise control over the growth conditions due to higher diffusion of the A-side dopants.

According to at least one embodiment of the method, an auxiliary carrier is attached to the semiconductor body prior to removal of the growth substrate. The p-side semiconductor layer is arranged in particular between the auxiliary carrier and the n-side semiconductor layer. The transparent current spreading layer arranged on the first semiconductor layer can have an exposed surface which is structured. In a subsequent process step, the radiation-transmissive carrier can be applied onto the structured surface of the current spreading layer. In particular, the auxiliary carrier is removed from the semiconductor body only after the carrier has been attached.

According to at least one of embodiment of the method, a further current spreading layer, namely a p-side current spreading layer, is formed on the p-side semiconductor layer, for instance prior to the removal of the growth substrate. The p-side current spreading layer may have a structured surface including out-coupling structures. For example, the carrier is attached to the structured surface of the p-side current spreading layer. The growth substrate is removed to expose the n-side semiconductor layer, wherein the transparent n-side current spreading layer is formed on the exposed n-side semiconductor layer. The p-side current spreading layer can be radiation-transmissive or transparent.

The method described above is particularly suitable for producing one or a plurality of the semiconductor chips described above. The features described in connection with the semiconductor chip can therefore also be used for the method and vice versa.

BRIEF DESCRIPTION OF THE DRAWINGS

In the embodiments and figures, components which are the same or of the same type, or which have the same effect, are respectively provided with the same references. The elements represented and their size ratios with respect to one another are not to be regarded as to scale. Rather, individual elements, in particular layer thicknesses, may be represented exaggeratedly large for better understanding.

FIGS. 3A, 3B, 3C, 3D, 4A, 4B, 4C, 4D and 4E show schematic representations of some method steps of further exemplary embodiments for producing one or a plurality of semiconductor chips.

DETAILED DESCRIPTION

Figure 1A:
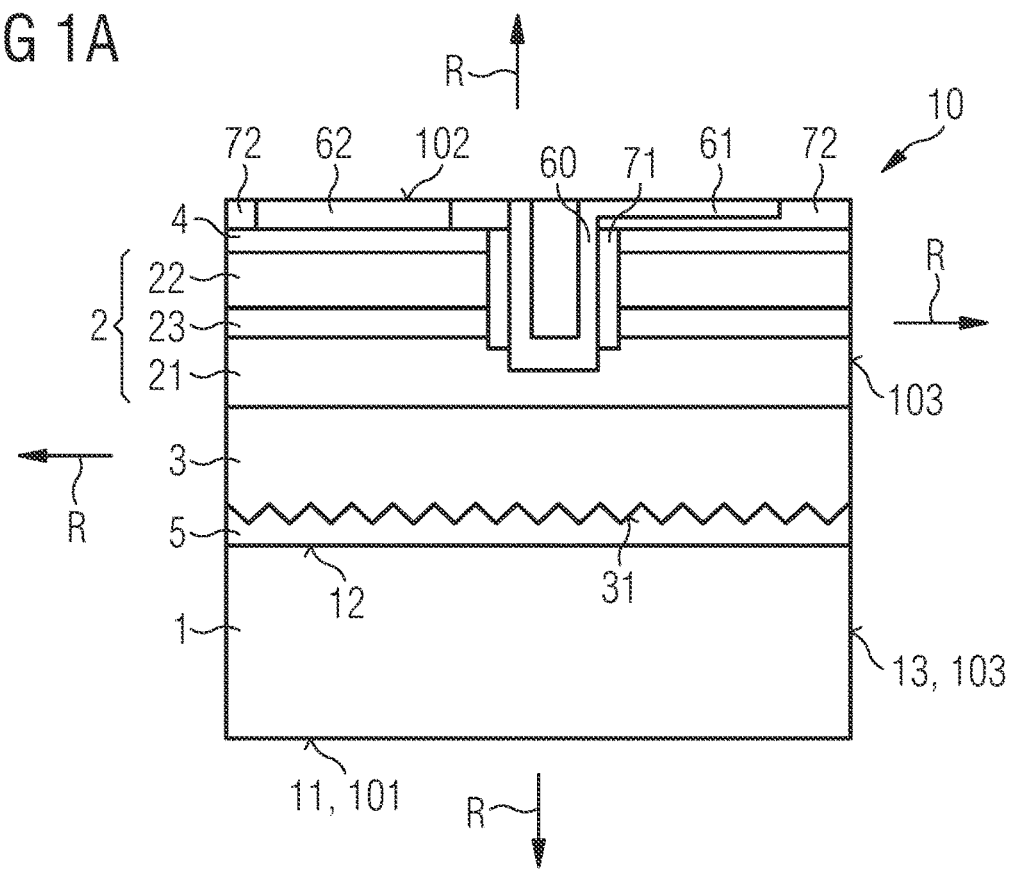
FIGS. 1A, 1B, 1C, 1D, 1E and 1F show schematic representations of a semiconductor chip according to various exemplary embodiments.

A first exemplary embodiment of a semiconductor chip 10 is schematically shown in FIG. 1A. The semiconductor chip 10 has a radiation-transmissive carrier 1 and a semiconductor body 2 arranged thereon. The semiconductor chip 10 has an n-side current spreading layer 3 adjacent to the semiconductor body 2. The n-side current spreading layer 3 is arranged in the vertical direction between the semiconductor body 2 and the carrier 1. The carrier 1 is mechanically connected to the semiconductor body 2 or to the n-side current spreading layer 3 by a connecting layer 5 which in particular is formed to be radiation-transmissive. The connecting layer 5 is particularly adjacent to the n-side current spreading layer 3.

The semiconductor body 2 has an n-side semiconductor layer 21 which faces the radiation-transmissive carrier 1 and in particular adjoins the n-side current spreading layer 3. The semiconductor body 2 has a p-side semiconductor layer 22 which faces away from the radiation-transmissive carrier 1. Furthermore, the semiconductor body has an optically active zone 23 which is arranged between the n-side semiconductor layer 21 and the p-side semiconductor layer 22.

According to FIG. 1A, the semiconductor chip 10 has a further current spreading layer 4 which is arranged on the p-side and adjoins for instance the p-side semiconductor layer 22. For example, semiconductor body 2 is based on a III-V compound material. The p-side current spreading layer 4 may also be formed from a III-V compound material. The n-side current spreading layer 3 may be based on zinc selenide and is thus different from a III-V compound material.

The semiconductor chip 10 has a front side 101 and a rear side 102. The front side 101 of the semiconductor chip 10 is formed in particular by a front side 11 of the carrier 1. The carrier 1 has a rear side 12 facing away from the front side 11 or 101, which in particular adjoins the connecting layer 5. The semiconductor chip 10 has side surfaces 103 that connect the front side 101 with the rear side 102 along the vertical direction. The side surfaces 103 of the semiconductor chip 10 are formed by side surfaces 13 of the carrier 1 and by side surfaces of the semiconductor body 2.

The semiconductor chip 10 has a first contact layer 61 and a second contact layer 62 on its rear side 102, as a result of which the contact layers 61 and 62 are freely accessible on the rear side 102 and are configured for electrically contacting the semiconductor body 2. The first contact layer 61 is electrically conductively connected to the first n-side semiconductor layer 21 via a through-via 60. The through-via 60 extends from the rear side 102 of the semiconductor chip 10 throughout the p-side current spreading layer 4, the second p-side semiconductor layer 22 and the active zone 23 into the first semiconductor layer 21. In particular, the through-via 60 is in direct electrical contact with the first semiconductor layer 21. The second contact layer 62 can be in direct electrical contact with the p-side current spreading layer 4.

According to FIG. 1A, the semiconductor chip 10 can be electrically contacted externally only via its rear side 102, namely via the contact layers 61 and 62. The semiconductor chip 10 has a first insulation layer 71 which prevents direct electrical contact between the through-via 60 on one side and the p-side current spreading layer 4, the second semiconductor layer 22 and the active zone 23 on the other side.

In lateral directions, the through-via 60 is completely enclosed by the first insulation layer 71, at least in places. Likewise, according to FIG. 1A, the through-via 60 is completely surrounded in lateral directions by the p-side current spreading layer 4, the second semiconductor layer 22 and the active zone 23.

The semiconductor chip 10 has a second insulation layer 72 for electrically insulating the contact layers 61 and 62. The second insulation layer is arranged in the vertical direction between the first contact layer 61 and the p-side current spreading layer 4 or the second semiconductor layer 22. The second insulation layer 72 may have an opening of the semiconductor body 2, in which the through-via 60 is located.

The front side 101 of the semiconductor chip 10 is free of the contact layers 61 and 62 as well as of other possible electrical connection surfaces of the semiconductor chip 10. In particular, the front side 101 forms a radiation exit surface of the semiconductor chip 10, for example in the case of a flip chip, at which the electromagnetic radiation R generated during operation of the semiconductor chip 10 in the active zone 23 is coupled out.

For increasing the out-coupling at the front side 101, the semiconductor chip can have an inner structured surface 31. In FIG. 1, the structured surface 31 is a surface of the n-side current spreading layer 3 facing towards the carrier 1. In particular, the semiconductor chip 10 is formed as a volume emitter, wherein electromagnetic radiation can be coupled out not only at the front side 101 but also at the rear side 102 and at the side surfaces 103 of the semiconductor chip 10.

In a non-limiting embodiment, the semiconductor body 2 is based on InGaP. The semiconductor body 2 can also contain aluminum. The n-side current spreading layer 3 may be based on ZnSe. The p-side current spreading layer 4 is based for instance on GaP. Both gallium phosphide and zinc selenide have a high transmittance for electromagnetic radiation in the visible and infrared spectral range. In addition, materials based on GaP or ZnSe have a high electrical conductivity. GaP- and ZnSe-based materials are therefore ideal for use as current spreading layers for semiconductor chips, especially for volume-emitting semiconductor chips based in particular on GaAs or GaP.

The n-side current spreading layer 3 and/or the p-side current spreading layer 4 can be doped n-conductively or p-conductively. Compared to conventional semiconductor chips, a zinc selenide-based current spreading layer, for instance an n-doped ZnSe-based current spreading layer made of ZnSSe or ZnCdSe, can replace a conventional current spreading layer made of InAlP. Alternatively or additionally, a GaP-based current spreading layer, for instance a p-doped GaP-based current spreading layer, can replace a conventional AlGaAs current spreading layer.

Figure 1B:
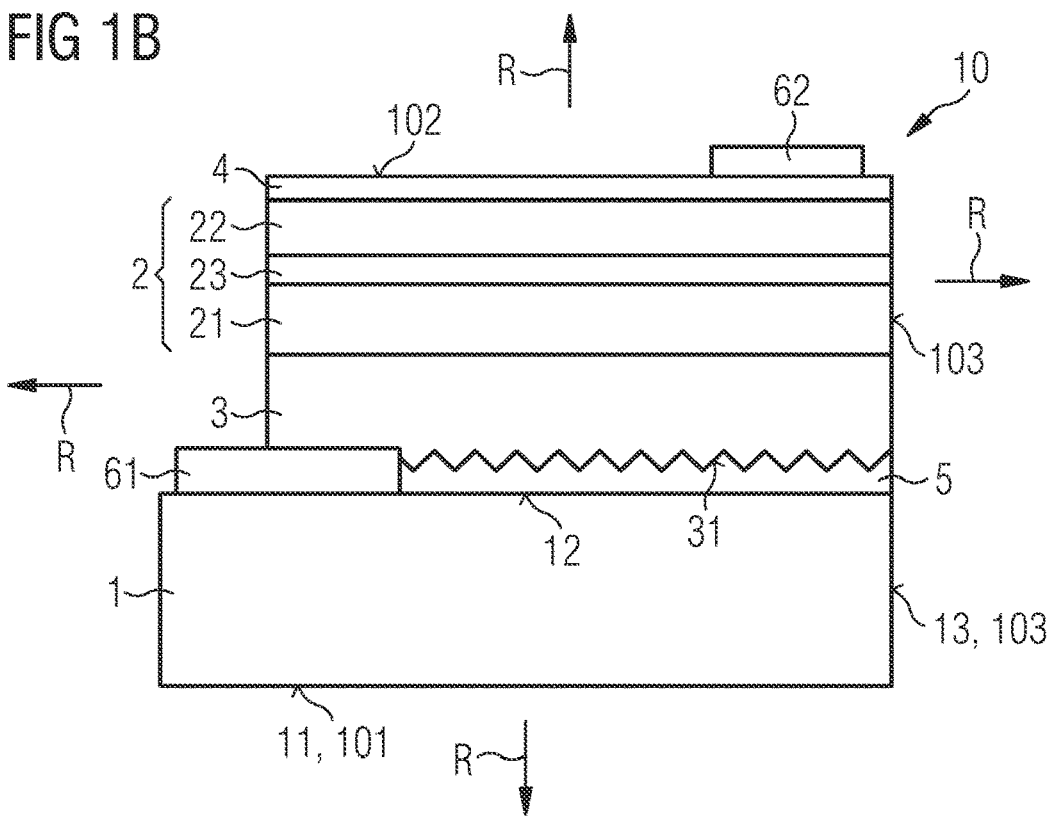

FIG. 1B shows a further exemplary embodiment of a semiconductor chip 10. The exemplary embodiment shown in FIG. 1B essentially corresponds to the exemplary embodiment of a semiconductor chip 10 shown in FIG. 1A. In contrast to this, the semiconductor chip 10 has a first contact layer 61 which is located in places between the semiconductor body 2 and the carrier 1.

In particular, the first contact layer 61 adjoins the n-side current spreading layer 3 and/or the connecting layer 5 in places. The first contact layer 61 is arranged in particular directly on the rear side 12 of the carrier 1. The first contact layer 61 can be electrically contacted externally on the rear side 12 of the carrier 1. In a plan view of the carrier 1, the semiconductor body 2 has a smaller cross-section than the carrier 1. The carrier 1 and/or the first contact layer protrude laterally over the semiconductor body 2. The first contact layer 61 is arranged in places on an overhang of the carrier 1 above the semiconductor body 2. In comparison to FIG. 1A, the rear side 102 of the semiconductor chip 1 can be free of the second insulation layer 72. Deviating from this, it is possible that the semiconductor chip 10 also includes the second insulation layer 72 on its rear side.

Figure 1C:
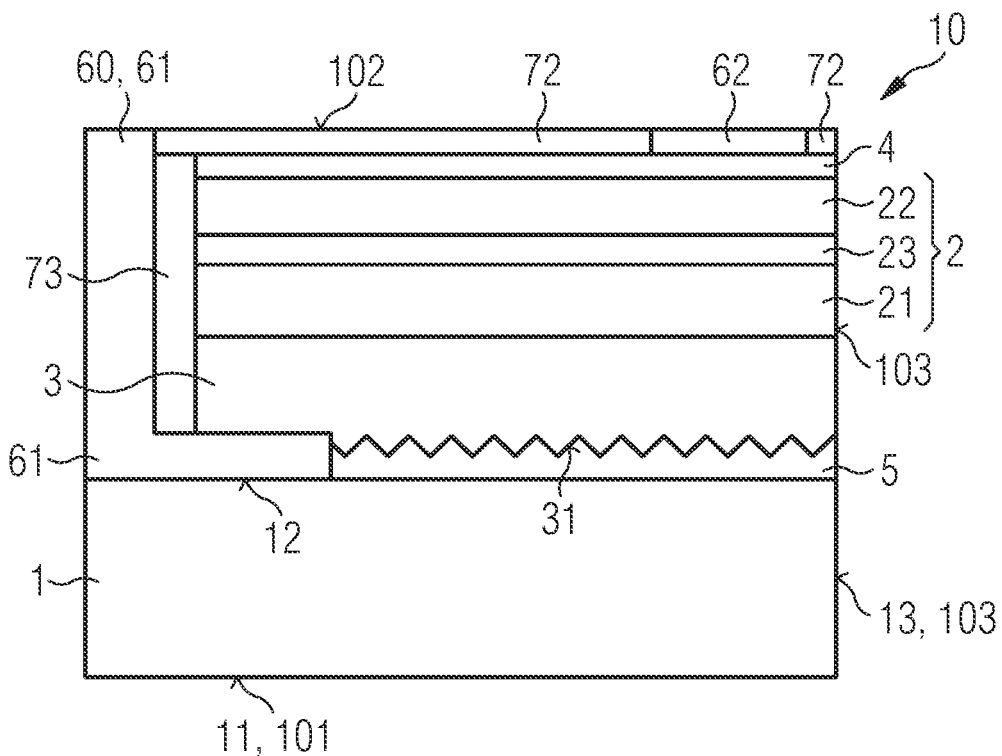

The exemplary embodiment shown in FIG. 1C essentially corresponds to the exemplary embodiment of a semiconductor chip 10 shown in FIG. 1B. In contrast to this, the semiconductor chip 10 has a through-via 60. The through-via 60 is electrically connected to the first contact layer 61, wherein the through-via 60 is electrically connectable via its contact surface or contact layer on the rear side 102 of the semiconductor chip 10.

The through-via 60 is located sideways of the semiconductor body 2. For preventing a direct electrical contact between the semiconductor body 2 and the through-via 60, a third insulation layer 73 is arranged sideways of the semiconductor body 2. In the lateral direction, the third insulation layer 73 is thus arranged between the semiconductor body 2 and the through-via 60. As shown in FIG. 1B, the n-side semiconductor layer 21 is neither in direct electrical contact with the first contact layer 61 nor with the through-via 60. Only via the n-side current spreading layer 3 is the n-side semiconductor layer 21 electrically conductively connected to the first contact layer 61 or to the through-via 60.

Figure 1D:
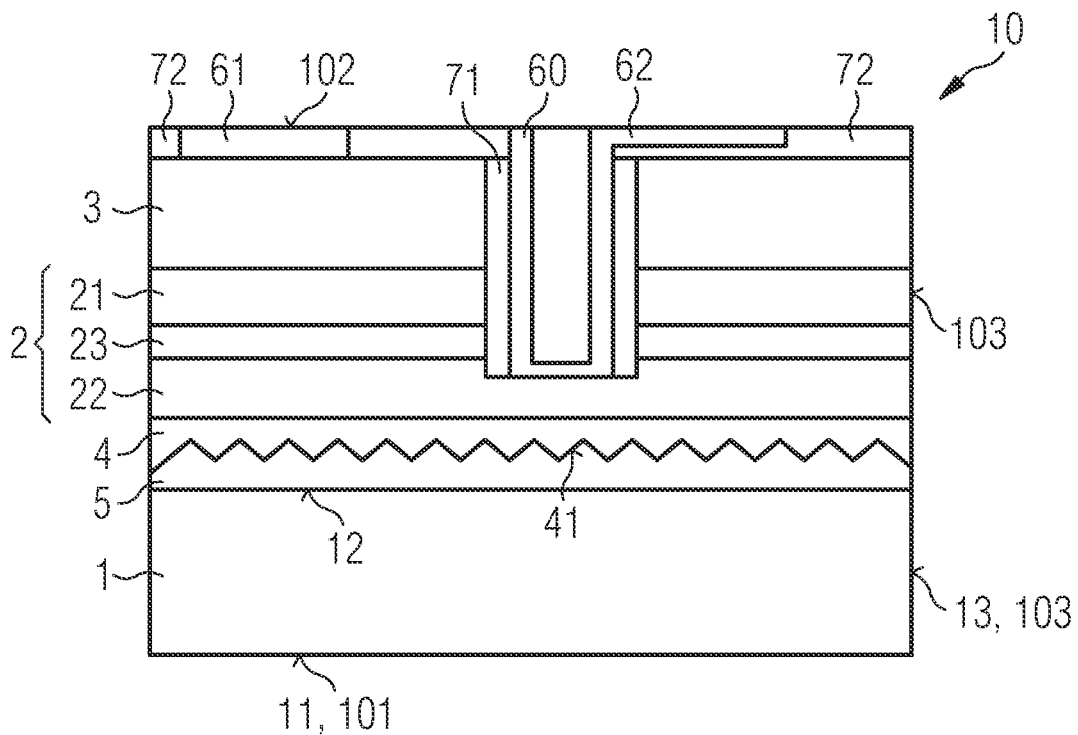

The exemplary embodiment shown in FIG. 1D essentially corresponds to the exemplary embodiment of a semiconductor chip 10 shown in FIG. 1A. In contrast to this, the semiconductor body 2 is arranged between the n-side current spreading layer 3 and the connecting layer 5. Thus, the semiconductor body 2 is arranged between the n-side current spreading layer 3 and the carrier 1.

In contrast to FIG. 1A, the n-side semiconductor layer 21 of the semiconductor body 2 faces away from the carrier 1 and the p-side semiconductor layer 22 faces towards the carrier 1. The first contact layer 61 is especially adjacent to the n-side current spreading layer 3. For minimizing the electrical contact resistance, the contact layer 61 may be made of ZnCdSe. The through-via 60 extends from the rear side 102 throughout the n-side current spreading layer 3, the n-side semiconductor layer 21 and the active zone 23 into the p-side semiconductor layer 22. In contrast to FIG. 1A, in this case, the through-via 60 is configured for electrically contacting the p-side semiconductor layer 22. Due to the first insulation layer 71, which completely surrounds the through-via 60 in lateral directions, the through-via 60 is electrically isolated from the n-side current spreading layer 3, the n-side semiconductor layer 21 and the active zone 23.

According to FIG. 1D, the semiconductor chip 10 has an internal structured surface 41 formed by a surface of the further p-side current spreading layer 4. The structured surface 41 is a surface of the p-side current spreading layer 4 facing towards the carrier 1 and in particular adjoins the connecting layer 5.

Figure 1E:
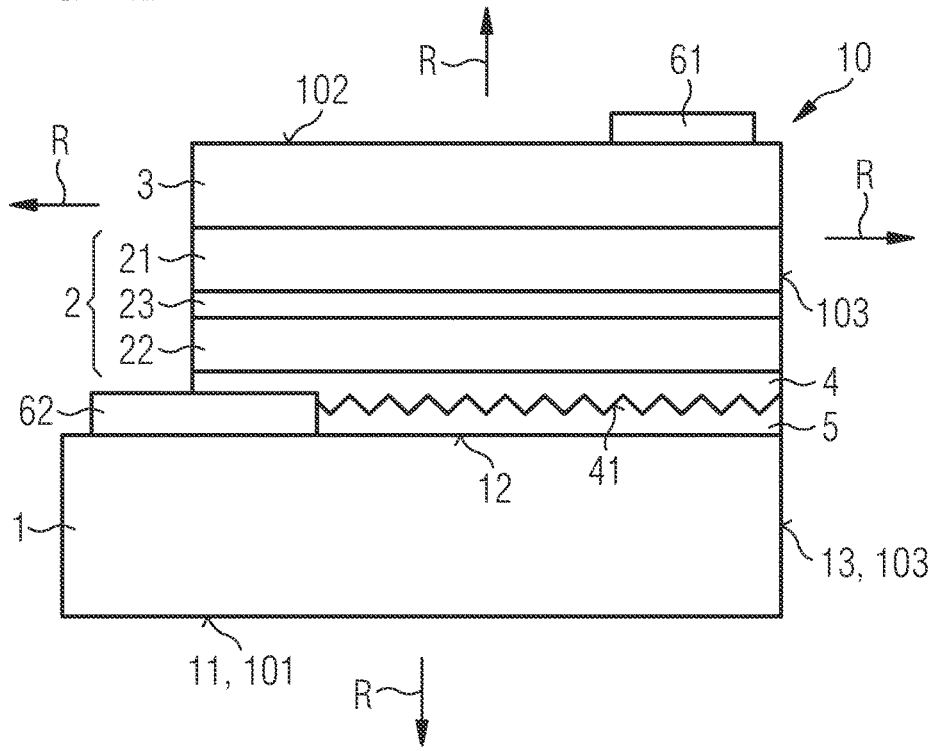

The exemplary embodiment shown in FIG. 1E essentially corresponds to the exemplary embodiment of a semiconductor chip 10 shown in FIG. 1D, but with a contact structure according to the exemplary embodiment shown in FIG. 1B.

The contact structure includes a first contact layer 61 and a second contact layer 62. The first contact layer 61 is located on the rear side 102 of the semiconductor chip 10. The second contact layer 62 is arranged in places between the semiconductor body 2 and the radiation-transmissive carrier 1. The second contact layer 62 is particularly adjacent to the p-side current spreading layer 4 and/or to the connecting layer 5 and/or to the carrier 1. Further analogous features with respect to the contact structure, which are described in connection with the exemplary embodiment shown in FIG. 1B, can be used for the exemplary embodiment shown in FIG. 1E, and vice versa.

Figure 1F:
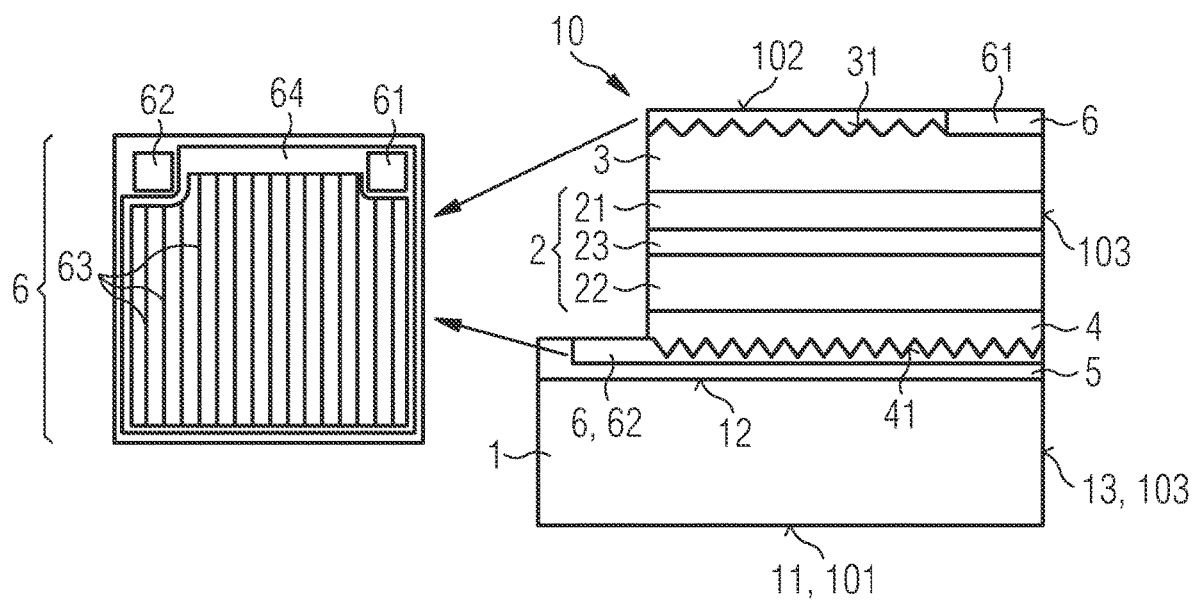

The exemplary embodiment shown in FIG. 1F essentially corresponds to the exemplary embodiment of a semiconductor chip 10 shown in FIG. 1E. In contrast to this, the n-side current spreading layer 3 has a structured surface 31 having out-coupling structures facing away from the carrier 1. Furthermore, the semiconductor chip 10 can have a contact structure 6 which is located on the n-side and/or on the p-side and includes a contact layer 61 or 62, at least one contact bar 64 and a plurality of conductor tracks 63.

The conductor tracks 63 of the n-side or p-side contact structure 6 can be electrically connected to each other via the contact bar 64. In particular, the conductor tracks 63 are arranged evenly on the n-side current spreading layer 3 and/or on the p-side current spreading layer 4, as a result of which the effect of the current expansion is enhanced within the n-side and/or the p-side current spreading layer 3 or 4.

In deviation to FIGS. 1E and 1F, the semiconductor chip 10 may have a through-via 60 as shown for instance in FIG.

Figure 1G:
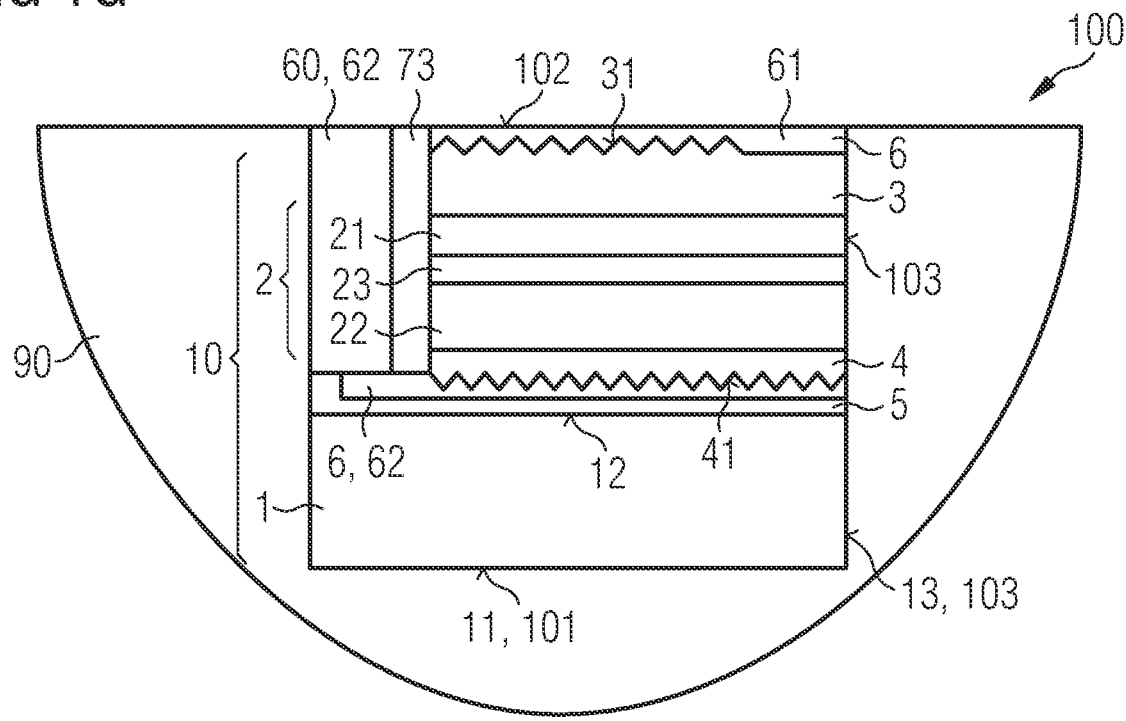
FIGS. 1G and 1H show schematic representations of various exemplary embodiments of a component including a semiconductor chip.

1C or 1D (see FIG. 1G). In contrast to FIGS. 1A, 1B, 1C, 1D and 1E, the semiconductor chips 10 shown in these figures may have two structured surfaces 31 and 41, which are shown for instance in FIG. 1F. Furthermore, the semiconductor chips 10 shown in FIGS. 1A, 1B, 1C, 1D and 1E may have an n-side and/or a p-side contact structure 6 as shown in FIG. 1F, including at least one connection bar 64 and a plurality of conductor tracks 63.

FIG. 1G shows a component 100. The component 100 includes a semiconductor chip 10 and an encapsulation 90. The exemplary embodiment of a semiconductor chip 10 shown in FIG. 1G is substantially the same as the exemplary embodiment shown in FIG. 1F but with a sideward through-via 60.

In particular, the encapsulation 90 is radiation-transmissive or transparent and has a lower refractive index than the carrier 1 and/or the semiconductor chip 10. The semiconductor chip 10 is encapsulated by the encapsulation 90 in such a way that the carrier 1 is completely embedded within the encapsulation 90. On the rear side 102, the encapsulation 90 can be flush with the semiconductor chip 10. The contact layer 61 and/or the further contact layer 62 can remain uncovered by a material of the encapsulation 90 at least in places and can still be freely accessible on the rear side 102 of the semiconductor chip 10 or of the component 100.

Radiation losses due to total reflections at an interface between the semiconductor chip 10 and the ambient air can be reduced by encapsulating the semiconductor chip 10 by the encapsulation 90. An efficient component 100 having a particularly low overall height can be achieved by encapsulating, wherein the rear side 103 of the semiconductor chip 10 remains at least partially or completely free of a material of the encapsulation 90.

Figure 1H:
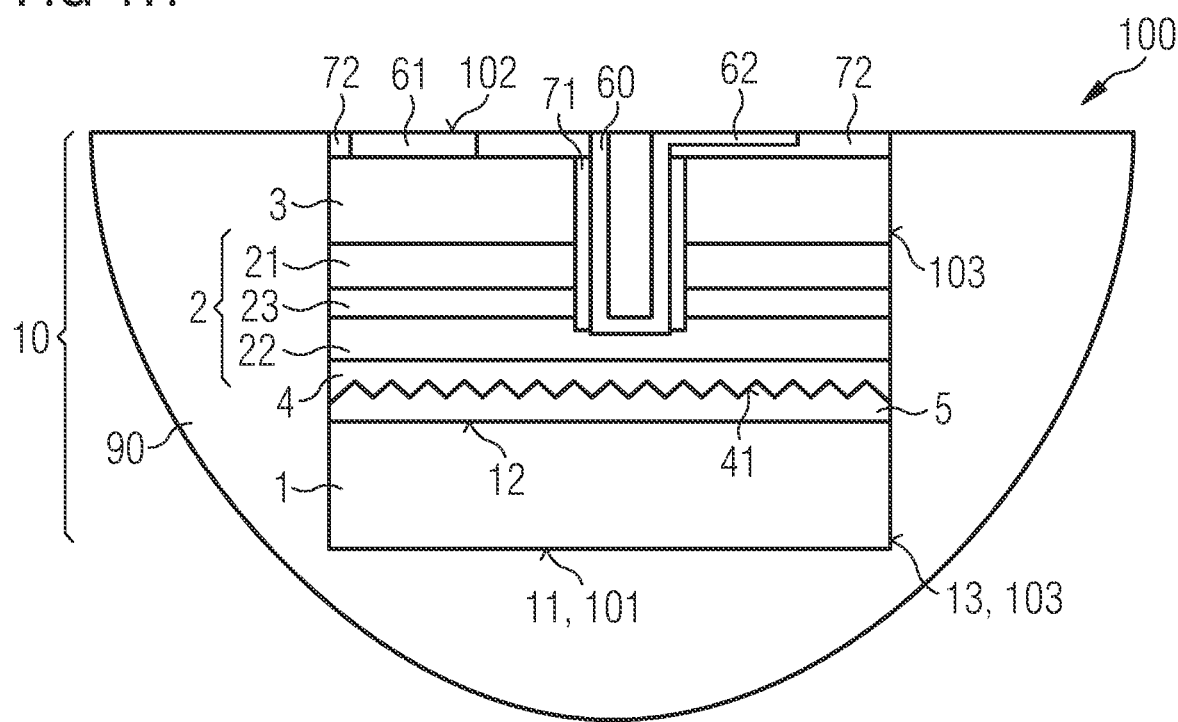

The exemplary embodiment of a component 100 shown in FIG. 1H essentially corresponds to the exemplary embodiment shown in FIG. 1G. In contrast to this, the component has a semiconductor chip 10 shown in FIG. 1D. Deviating from FIGS. 1G and 1H, the device 100 may have a semiconductor chip 10, which is shown in FIG. 1A, 1B, 1C, 1E, or in FIG. 1F, for example.

Figure 2A:
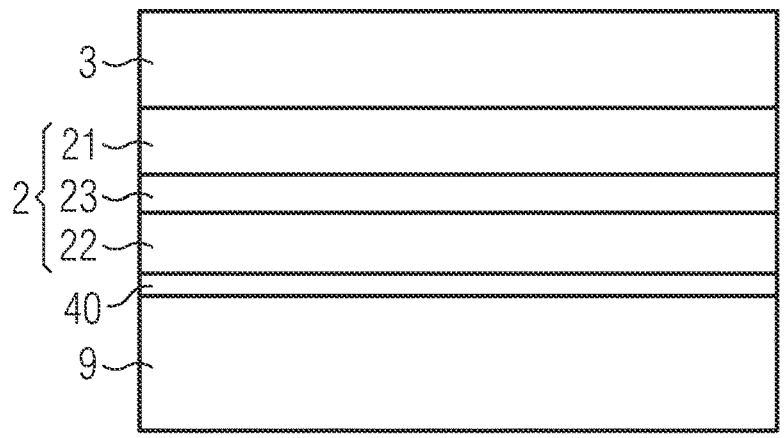
FIGS. 2A and 2B show schematic representations of some method steps for producing one or a plurality of semiconductor chips according to a first exemplary embodiment.
Figure 2B:
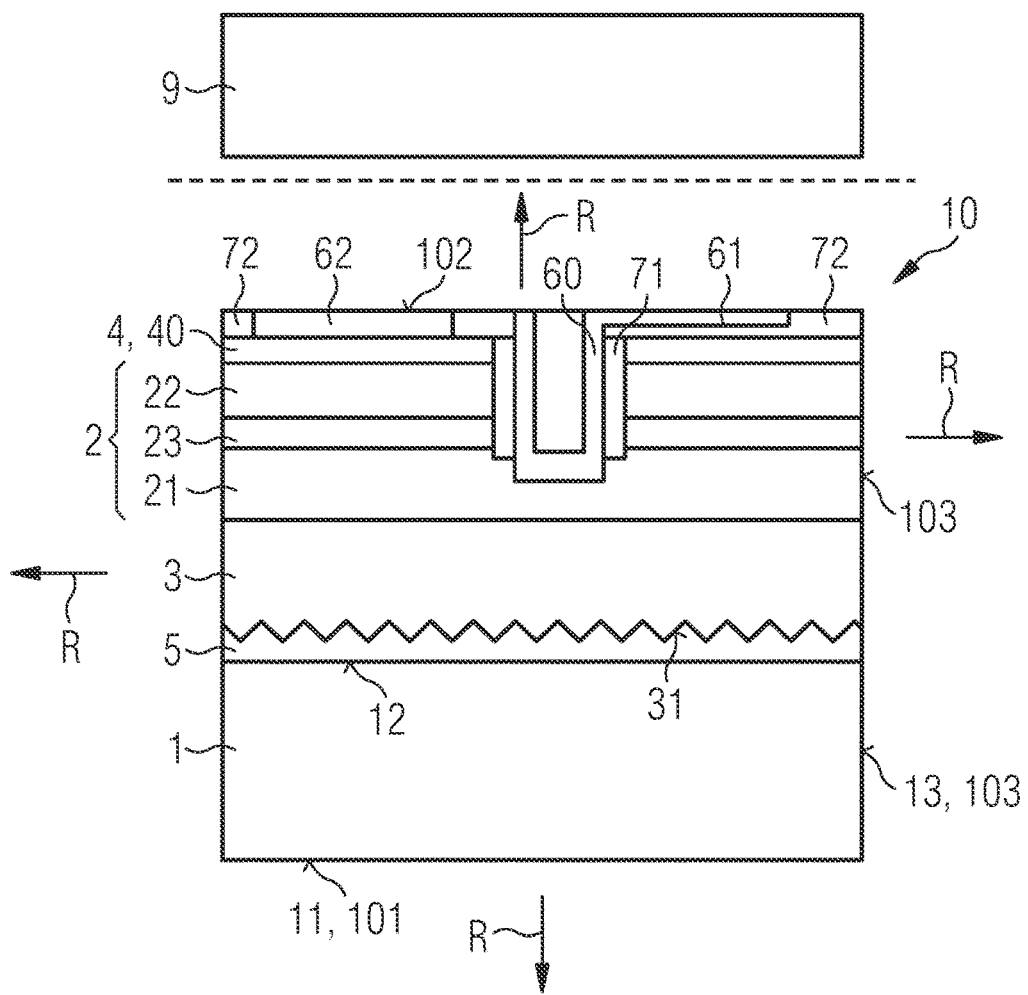

Some process steps according to a first exemplary embodiment of a method for producing one or a plurality of semiconductor chips 10 are shown in FIGS. 2A and 2B.

According to FIG. 2A, a growth substrate 9, for instance made from gallium arsenide or gallium phosphide, is provided. A p-side semiconductor layer 22, an active zone 23, an n-side semiconductor layer 21 of the semiconductor body 2 and an n-side current spreading layer 3 can be formed in the given order on the growth substrate 9, in particular successively during a common coating process. According to this variant, the ZnSe-based current spreading layer 3 can be formed only after the semiconductor body 2 has been formed. This is expedient, since the formation of the semiconductor body 2, which is based on InGaP for example, usually takes place at such a high temperature which could damage the functionality of the ZnSe-based current spreading layer 3.

Optionally, a p-side buffer layer 40 can be formed between the growth substrate 9 and the semiconductor body 2. The p-side buffer layer 40 can be a separating layer, such as a sacrificial layer for separating the growth substrate 9, or a further p-side current spreading layer.

According to FIG. 2B, an exposed surface of the n-side current spreading layer 3 can be structured prior to the attachment of the semiconductor body 2 to a radiation-transmissive carrier 1 by a connecting layer 5. After attaching the semiconductor body 2 having the n-side current spreading layer 3 to the carrier 1, the growth substrate 9 can be detached from the semiconductor body 2 by a mechanical, chemical or laser lifting process, for example.

It is possible that the further current spreading layer 4, which is particularly GaP-based, is formed on the semiconductor body 2 only after the detachment of the growth substrate 9, for instance of the GaAs-based growth substrate 9. Due to a high lattice mismatch between GaAs and GaP, this leads to a better crystal quality of the semiconductor body 2 compared to the case where GaP is formed on the GaAs-growth substrate 9, for example, before semiconductor body 2 is formed.

After removing the growth substrate 9, a contact structure 6 including a first contact layer 61, a second contact layer 62 and/or a through-via 60 can be formed on the rear side 102 of the semiconductor chip 10.

The semiconductor chip 10 shown in FIG. 2B corresponds to the semiconductor chip 10 shown in FIG. 1A. Deviating from FIG. 2A, a semiconductor chip can be produced according to FIG. 1B or according to FIG. 1C by the exemplary embodiment of a method as shown in FIGS. 2A and 2B.

FIGS. 3A to 3D show some process steps of a further exemplary embodiment of a method for producing one or a plurality of semiconductor chips 10.

Figure 3A:
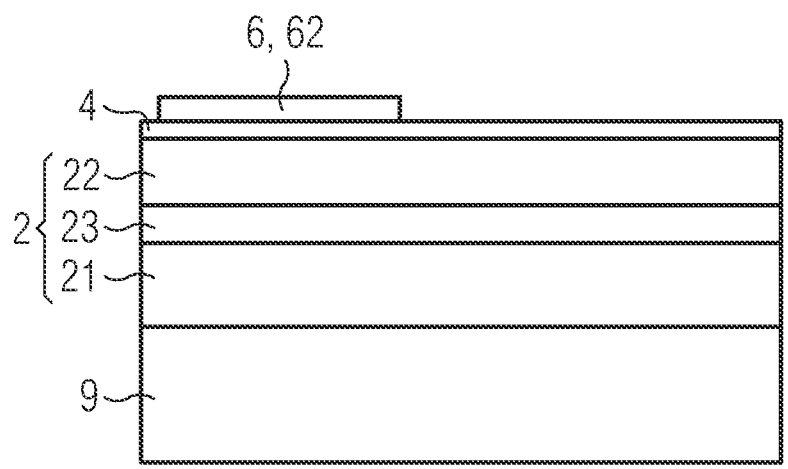

According to FIG. 3A, the n-side semiconductor layer 21, the active zone 23 and the p-side semiconductor layer 22 of the semiconductor body 2 are applied onto the growth substrate 9. Optionally, the p-side current spreading layer 4 based for instance on GaP can be formed on the p-side semiconductor layer 22. A contact structure 6 including the second contact layer 62 is formed on the p-side current spreading layer 4 or on the semiconductor layer 22.

Figure 3B:
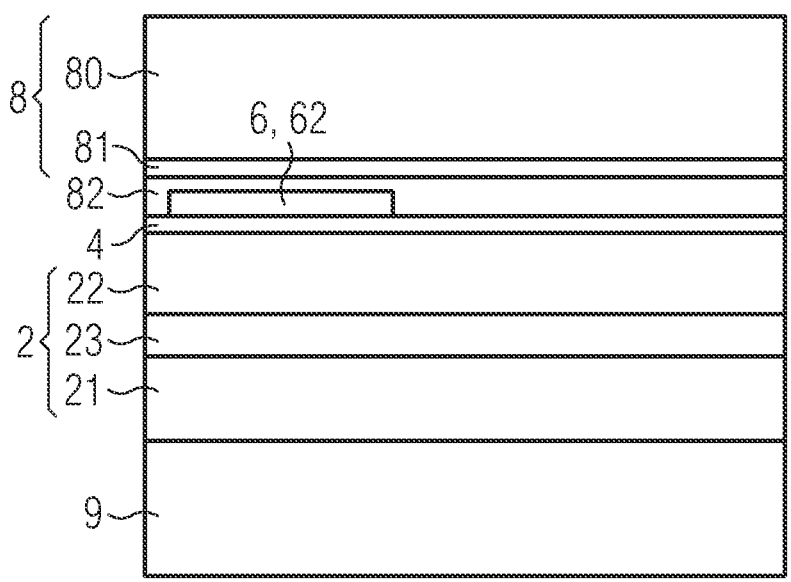

According to FIG. 3B, an auxiliary carrier 8 is applied on the semiconductor body 2 prior to the removal of the growth substrate 9. The auxiliary carrier 8 has a main body 80, wherein a separating or protective layer 81 is disposed on the main body 80. The main body 80 may be formed from silicon. By means of a further connecting layer 82, which in particular is electrically insulating, the auxiliary carrier 8 is attached to the semiconductor body 2 and the growth substrate 9. In particular, a bonding process suitable for high temperatures is used for this purpose, wherein in further process steps, the further connecting layer 82 can withstand a temperature higher than 250° C., for instance between 250° C. and 400° C.

According to FIG. 3C, after attaching the auxiliary carrier 8, the growth substrate 9 is removed from the semiconductor body 2. The n-side current spreading layer 3 can be applied onto a surface of the n-side semiconductor layer 21 which is exposed by the removal of the growth substrate 9.

Figure 3D:
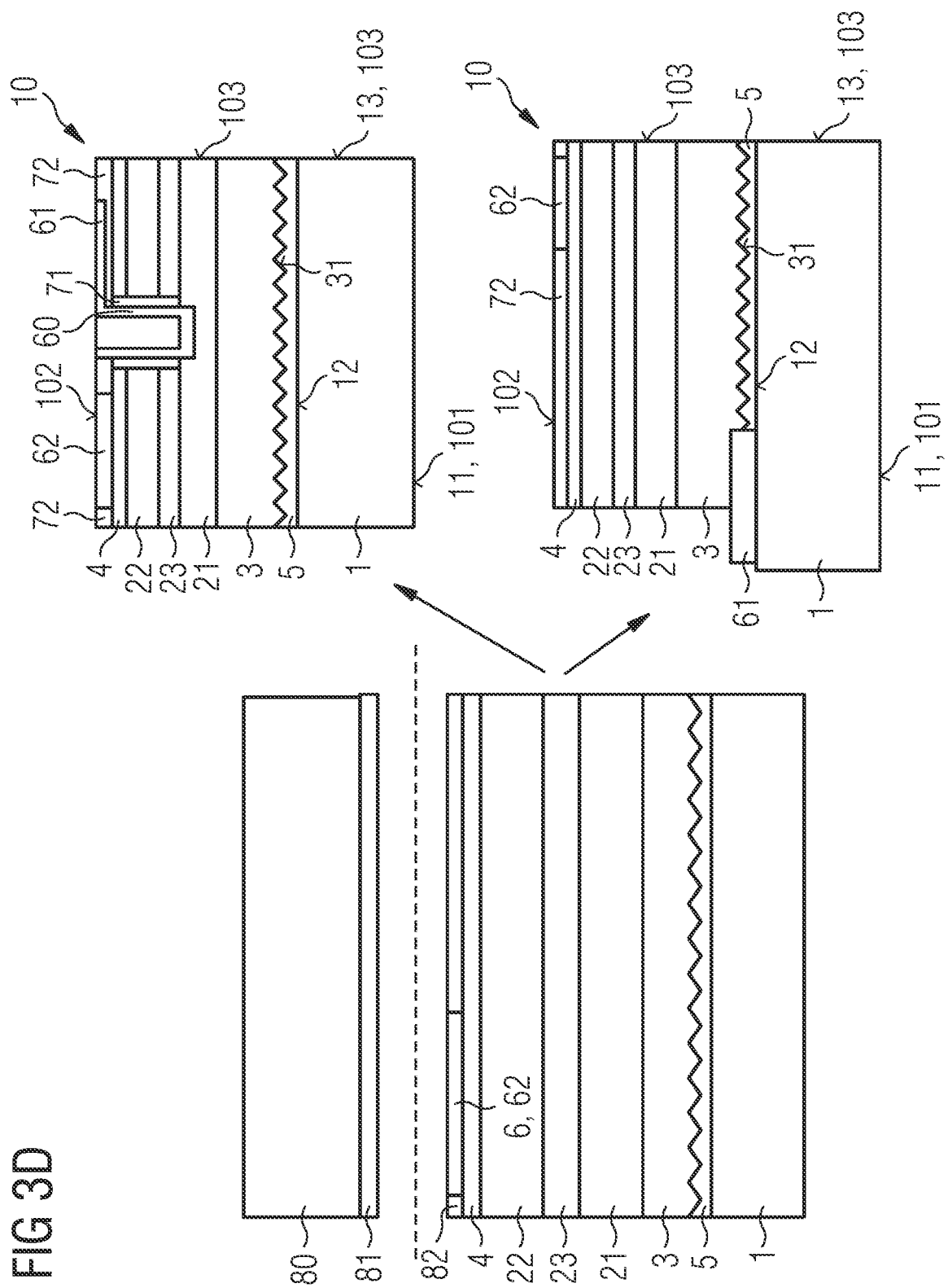

According to FIG. 3D, after the radiation-transmissive carrier 1 has been attached, the auxiliary carrier 8 is removed from the semiconductor body 2, for instance at the further connecting layer 82. Before attaching the radiation-transmissive carrier 1, an exposed surface 31 of the n-side current spreading layer 3 can be structured. After removing the auxiliary carrier 8, the semiconductor body 2 can be further processed on the radiation-transmissive carrier 1 to produce the semiconductor chip 10. In particular, the second insulation layer 72 can be formed by the electrically insulating connecting layer 82. The semiconductor chips 10 shown in FIG. 3D on the right-hand side correspond to the semiconductor chips 10 shown in FIGS. 1A and 1B.

FIGS. 4A to 4E show some process steps according to further exemplary embodiment of a method for producing one or a plurality of semiconductor chips 10.

Figure 4A:
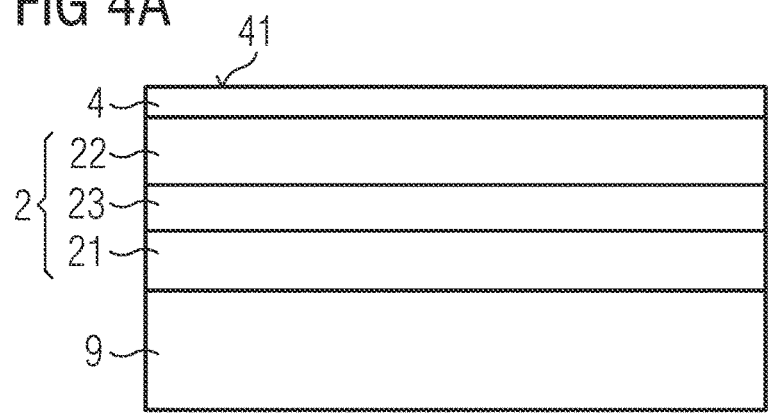
Figure 4B:
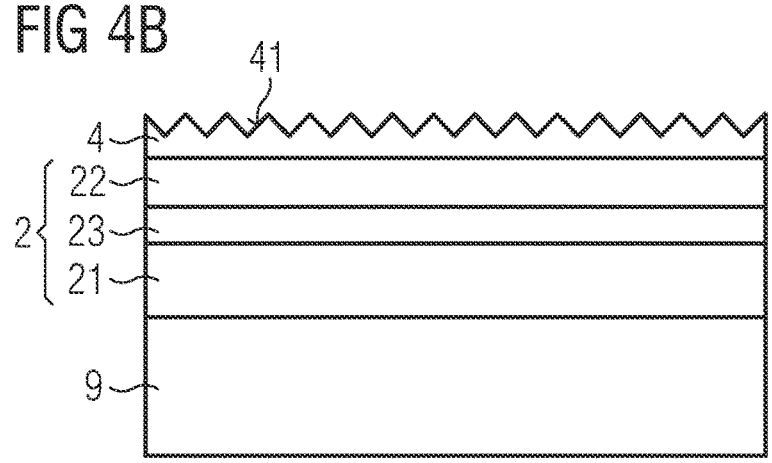

The process step shown in FIG. 4A is essentially the same as the process step shown in FIG. 3A. In contrast to this, an exposed surface 41 of the p-side current spreading layer is structured according to FIG. 4B.

Figure 4C:
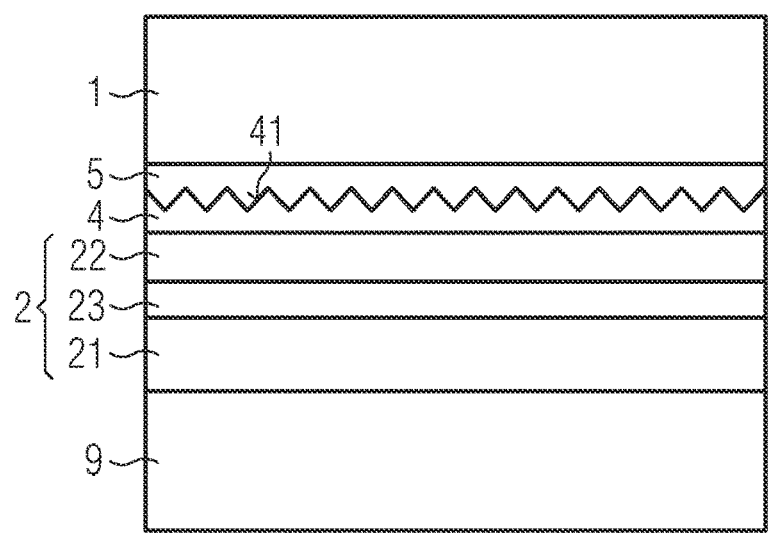

After structuring the p-side current spreading layer 4, the semiconductor body 2 is attached to the radiation-transmissive carrier 1 by the radiation-transmissive connecting layer 5. In particular, a bonding process suitable for high temperatures is applied, wherein in subsequent process steps, the connecting layer 5 can withstand a temperature higher than 250° C., for instance between 250° C. and 400° C. Here, the p-side current spreading layer 4 is arranged between the carrier 1 and the semiconductor body 2 and in particular adjoins the connecting layer 5 (FIG. 4C).

After attaching carrier 1, the growth substrate 9 is removed from the semiconductor body 2 as shown in FIG. 4D. By removing the growth substrate 9, a surface of the n-side semiconductor layer 21 can be exposed.

According to FIG. 4E, the n-side current spreading layer 3 is applied to the surface of the n-side semiconductor layer 21 which is exposed by the removal of the growth substrate 9. Subsequently, further process steps can be carried out for producing the semiconductor chip 10. The semiconductor chips 10 shown on the right-hand side in FIG. 4E correspond to the semiconductor chips 10 shown in FIGS. 1D and 1E.

The variants shown in FIGS. 2A to 4E are particularly suitable for producing a semiconductor chip including a ZnSe-based current spreading layer and/or a GaP-based current spreading layer, as these fabrication methods have the common features that both the ZnSe-based and GaP-based current spreading layers can be fabricated in a reliable and simplified manner, namely after the semiconductor body has been formed. This is expedient because the formation of the semiconductor body is typically performed at such a high temperature that could adversely affects the functionality of the ZnSe-based current spreading layer.

Furthermore, due to a high lattice mismatch between GaAs and GaP, it is not expedient to grow the GaP-based current spreading layer directly on GaAs, for example, but InGaP-based layers may be grown on GaAs first and then the GaP-based current spreading layer on the InGaP-based layers. Using the variants shown in FIGS. 3A to 4E, it is also possible to achieve a semiconductor chip having a particularly high crystal quality and a high-temperature connection between a semiconductor body of the semiconductor chip and a carrier or auxiliary carrier.

This application claims the priority of the German patent application 10 2017 114 467.6, the disclosure content of which is hereby included by reference.

The invention is not restricted to the exemplary embodiments by the description of the invention made with reference to exemplary embodiments. The invention rather includes any novel feature and any combination of features, including in particular any combination of features in the claims, even if this feature or this combination is not itself explicitly indicated in the patent claims or exemplary embodiments.

LIST OF REFERENCE NUMERALS

10 Semiconductor chip
100 Component
101 Front side/carrier side of the semiconductor chip/component
102 Rear side of the semiconductor chip/component
103 Side surface of the semiconductor chip/component
1 Carrier
11 Front side of the carrier
12 Rear side of the carrier
13 Side surface of the carrier
2 Semiconductor body
21 First semiconductor layer
22 Second semiconductor layer
23 Active zone
3 N-side current spreading layer
31 Surface of the n-side current spreading layer
4 Further/p-side current spreading layer
40 P-side buffer layer/separating layer
41 Surface of the p-side current spreading layer
5 Connecting layer
6 Contact structure
60 Through-via
61 First contact layer
62 Second contact layer
63 Conductor tracks
64 Contact bar
71 First insulation layer
72 Second insulation layer
73 Third insulation layer
8 Auxiliary carrier
80 Main body of the auxiliary carrier
81 Separating/protective layer
82 Further connecting layer/insulation layer
9 Growth substrate
90 Encapsulation
R Radiation

The invention claimed is:

1. A semiconductor chip comprising:
a radiation-transmissive carrier;
a semiconductor body fixed to the radiation-transmissive carrier by a radiation-transmissive connecting layer; wherein the semiconductor body comprises an n-side semiconductor layer, a p-side semiconductor layer, and an optically active zone located therebetween; and
a transparent current spreading layer comprising zinc selenide; wherein the transparent current spreading layer adjoins the n-side semiconductor layer; and
a further radiation-transmissive current spreading layer adjacent to the p-side semiconductor layer;
wherein the semiconductor chip is configured as a volume emitter, wherein electromagnetic radiation generated during operation of the semiconductor chip is configured to be coupled out via a front side, a rear side, and via side surfaces of the semiconductor chip.

2. The semiconductor chip according to claim 1, wherein the transparent current spreading layer is an n-side current spreading layer having a structured surface comprising out-coupling structures facing away from the radiation-transmissive carrier; and
the further radiation-transmissive current spreading layer is a p-side current spreading layer having a structured surface comprising out-coupling structures.

3. The semiconductor chip according to claim 2, wherein the further radiation-transmissive current spreading layer comprises GaP; and wherein the semiconductor chip is free of a current spreading layer comprising AlGaAs or InAlP.

4. The semiconductor chip according to claim 1, wherein the semiconductor body comprises a III-V semiconductor compound material and the semiconductor chip is free of a III-V growth substrate.

5. The semiconductor chip according to claim 1, wherein the radiation-transmissive carrier comprises an electrically insulating material and has a front side facing away from the semiconductor body, the front side being free of electrical connections of the semiconductor chip.

6. The semiconductor chip according to claim 1, wherein the semiconductor body comprises InGaP or InGaAlP; and wherein the semiconductor chip is free of a current spreading layer comprising InAlP.

7. The semiconductor chip according to claim 1, wherein:
the further radiation-transmissive current spreading layer comprises GaP and adjoins the p-side semiconductor layer; and
the semiconductor chip is free of a current spreading layer comprising AlGaAs.

8. The semiconductor chip according to claim 1, wherein the rear side faces away from the radiation-transmissive carrier, further comprising:
a contact layer on the rear side that is freely accessible;
a further contact layer arranged at least in regions between the semiconductor body and the radiation-transmissive carrier and adjoining the radiation-transmissive connecting layer; and
wherein the contact layer and the further contact layer are assigned to different electrical polarities of the semiconductor chip and are configured for electrically contacting the semiconductor body.

9. The semiconductor chip according to claim 1, wherein the rear side faces away from the radiation-transmissive carrier and a through-via is configured for electrically contacting the n-side semiconductor layer, wherein
the transparent current spreading layer is arranged between the semiconductor body and the radiation-transmissive connecting layer, and
the through-via extends from the rear side throughout the p-side semiconductor layer and the optically active zone into the n-side semiconductor layer and is not in direct electrical contact with the transparent current spreading layer.

10. The semiconductor chip according to claim 1, wherein the rear side faces away from the radiation-transmissive carrier and a through-via is configured for electrically contacting the n-side semiconductor layer, wherein
the transparent current spreading layer is arranged between the semiconductor body and the radiation-transmissive connecting layer; and
the through-via extends from the rear side throughout the p-side semiconductor layer, the optically active zone, and the n-side semiconductor layer; and wherein the through-via is not in direct electrical contact with the n-side semiconductor layer.

11. The semiconductor chip according to claim 1, wherein the rear side faces away from the radiation-transmissive carrier and a through-via is configured for electrically contacting the p-side semiconductor layer, wherein
the semiconductor body is arranged between the transparent current spreading layer and the radiation-transmissive connecting layer, and
the through-via extends from the rear side throughout the transparent current spreading layer, the n-side semiconductor layer and the optically active zone.

12. The semiconductor chip according to claim 1, further comprising an inner structured surface comprising out-coupling structures, wherein the inner structured surface is arranged between the active zone and the radiation-transmissive carrier.

13. The semiconductor chip according to claim 1, wherein the transparent current spreading layer comprises at least one of the additional chemical elements selected from the group consisting of S, Cd, Mg, Be, or combinations thereof.

14. A component comprising a semiconductor chip according to claim 1 and a radiation transmissive encapsulation having a lower refractive index than the radiation-transmissive carrier; and wherein the semiconductor chip is encapsulated by the radiation transmissive encapsulation such that
the radiation-transmissive carrier is completely embedded within the enclosure; and
a contact layer on a rear side of the semiconductor chip configured for electrically contacting the semiconductor body, wherein the contact layer is at least partially free of the radiation transmissive encapsulation.

15. A method for producing a semiconductor chip comprising:
a radiation-transmissive carrier;
a semiconductor body fixed to the radiation-transmissive carrier by a radiation-transmissive connecting layer; wherein the semiconductor body comprises an n-side semiconductor layer, a p-side semiconductor layer, and an optically active zone located therebetween; and
a transparent current spreading layer comprising zinc selenide; wherein the transparent current spreading layer adjoins the n-side semiconductor layer;
wherein the method comprises:
providing a growth substrate;
applying the semiconductor body onto the growth substrate by a coating method; and
attaching the semiconductor body to the radiation-transmissive carrier by the radiation-transmissive connecting layer.

16. The method according to claim 15, further comprising:
forming the p-side semiconductor layer, the n-side semiconductor layer, and the transparent current spreading layer on the growth substrate in the order given;
forming the transparent current spreading layer comprising an exposed surface that is structured before the radiation-transmissive carrier is attached to the semiconductor body; and
removing the growth substrate from the semiconductor body after the radiation-transmissive carrier is attached.

17. The method according to claim 15, further comprising:
forming the n-side semiconductor layer and the p-side semiconductor layer on the growth substrate in the order given;
removing the growth substrate; and
forming the transparent current spreading layer on the n-side semiconductor layer.

18. The method according to claim 17, further comprising mounting an auxiliary carrier on the semiconductor body prior to removing the growth substrate;
forming an exposed surface of the transparent current spreading layer,
mounting the radiation-transmissive carrier on the exposed surface of the current spreading layer; and
removing the auxiliary carrier from the semiconductor body.

19. The method according to claim 17, further comprising:
forming a p-side current spreading layer on the p-side semiconductor layer prior to the removal of the growth substrate, wherein: the p-side current spreading layer has a structured surface comprising out-coupling structures;
mounting the radiation-transmissive carrier on the structured surface of the p-side current spreading layer;

removing the growth substrate to expose the n-side semiconductor layer; and forming the transparent current spreading layer on an exposed n-side semiconductor layer.

20. The method according to claim 15, wherein:

the semiconductor chip is configured as a volume emitter, wherein electromagnetic radiation generated during operation of the semiconductor chip is able to be coupled out via a front side, a rear side, and via side surfaces of the semiconductor chip;

the transparent current spreading layer is an n-side current spreading layer having a structured surface comprising out-coupling structures facing away from the radiation-transmissive carrier;

the semiconductor chip comprises a further radiation-transmissive current spreading layer, the further radiation-transmissive current spreading layer being adjacent to the p-side semiconductor layer and forming a p-side current spreading layer, and the p-side current spreading layer has a structured surface comprising out-coupling structures.

* * * * *